United States Patent
Liao et al.

(10) Patent No.: US 12,302,507 B2
(45) Date of Patent: May 13, 2025

(54) CIRCUIT BOARD STRUCTURE FOR DISPLAY DEVICE

(71) Applicant: AUO Corporation, Hsin-Chu (TW)

(72) Inventors: Chi-Sheng Liao, Hsin-Chu (TW);
Bo-Ru Jian, Hsin-Chu (TW);
Bin-Cheng Lin, Hsin-Chu (TW);
Ta-Wen Liao, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 177 days.

(21) Appl. No.: 18/169,724

(22) Filed: Feb. 15, 2023

(65) Prior Publication Data
US 2023/0276580 A1  Aug. 31, 2023

Related U.S. Application Data

(60) Provisional application No. 63/313,744, filed on Feb. 25, 2022.

(30) Foreign Application Priority Data

Jul. 27, 2022  (TW) .................................. 111128198

(51) Int. Cl.
*H05K 1/02* (2006.01)
*H01L 21/4763* (2006.01)
(Continued)

(52) U.S. Cl.
CPC .......... *H05K 3/4679* (2013.01); *H05K 1/036* (2013.01); *H05K 3/282* (2013.01); *H05K 3/4007* (2013.01);
(Continued)

(58) Field of Classification Search
CPC .......... H05K 1/02; H05K 1/036; H05K 3/282; H05K 3/4679; H05K 3/4007;
(Continued)

(56) References Cited

U.S. PATENT DOCUMENTS 10,707,179 B1 * 7/2020 Wu ..................... H01L 28/60
2001/0042918 A1 * 11/2001 Yanagida .............. H01L 23/48
257/781
(Continued)

FOREIGN PATENT DOCUMENTS

CN  110649069 A  1/2020
CN  113707674 A  11/2021
(Continued)

*Primary Examiner* — Xiaoliang Chen
(74) *Attorney, Agent, or Firm* — WPAT, PC

(57) ABSTRACT

A circuit board structure for a display device includes a substrate, a bump, a protective layer, and a moisture-resistant layer. The substrate includes a first surface and a second surface opposite to the first surface. The bump is disposed on the first surface of the substrate and includes a first inorganic material. The protective layer is disposed on the first surface of the substrate. The protective layer includes an organic material and a first opening, in which the bump is positioned in the first opening. The moisture-resistant layer entirely covers the protective layer. The moisture-resistant layer includes a second inorganic material and a second opening, in which a portion of the bump is exposed in the second opening.

9 Claims, 10 Drawing Sheets

(51) Int. Cl.
*H01L 21/768* (2006.01)
*H01L 21/78* (2006.01)
*H01L 23/485* (2006.01)
*H01L 23/522* (2006.01)
*H01L 23/528* (2006.01)
*H01L 23/66* (2006.01)
*H05K 1/03* (2006.01)
*H05K 3/28* (2006.01)
*H05K 3/40* (2006.01)
*H05K 3/46* (2006.01)

(52) U.S. Cl.
CPC . *H05K 3/4046* (2013.01); *H05K 2201/10128* (2013.01)

(58) Field of Classification Search
CPC ........ H05K 3/4046; H05K 2201/10128; H01L 21/02164; H01L 21/02697; H01L 21/78; H01L 21/768; H01L 21/3185; H01L 21/4763; H01L 21/31055; H01L 21/31111; H01L 21/67802; H01L 23/66; H01L 23/485; H01L 23/522; H01L 23/528; H01L 23/562; H01L 23/3135; H01L 23/3192; H01L 23/5223; H01L 24/03; H01L 24/06; H01L 24/10; H01L 24/11; H01L 24/13; H01L 24/14; H01L 24/48; H01L 24/49; H01L 24/81; H01L 24/97; H01L 2224/02166; H01L 2224/0519; H01L 2224/05186; H01L 2224/05647; H01L 2224/131; H01L 2224/13025

USPC .......... 361/748; 257/48, 197, 737, 738, 751, 257/753; 438/51, 113, 460, 612, 615
See application file for complete search history.

(56) References Cited

U.S. PATENT DOCUMENTS

| | | | |
|---|---|---|---|
| 2006/0030078 A1* | 2/2006 | Jiang | H01L 23/3192 257/E21.279 |
| 2008/0001290 A1* | 1/2008 | Chou | H01L 23/53252 257/E23.079 |
| 2008/0224174 A1* | 9/2008 | Sasaki | H01L 24/49 438/318 |
| 2009/0121349 A1* | 5/2009 | Suzuki | G02F 1/13458 257/737 |
| 2010/0295044 A1* | 11/2010 | Homma | H01L 23/562 257/773 |
| 2011/0254159 A1* | 10/2011 | Hwang | H01L 24/05 438/615 |
| 2015/0323657 A1* | 11/2015 | Machida | G01S 7/52079 600/459 |
| 2017/0365566 A1 | 12/2017 | Lee et al. | |
| 2018/0190602 A1 | 7/2018 | Lee et al. | |
| 2018/0247893 A1* | 8/2018 | Kayashima | H01L 23/528 |
| 2018/0269171 A1* | 9/2018 | Kato | H01L 24/05 |
| 2020/0335460 A1 | 10/2020 | Lee et al. | |
| 2021/0098399 A1* | 4/2021 | Huang | H01L 24/03 |

FOREIGN PATENT DOCUMENTS

| | | |
|---|---|---|
| CN | 215008275 U | 12/2021 |
| TW | 201810571 A | 3/2018 |

* cited by examiner

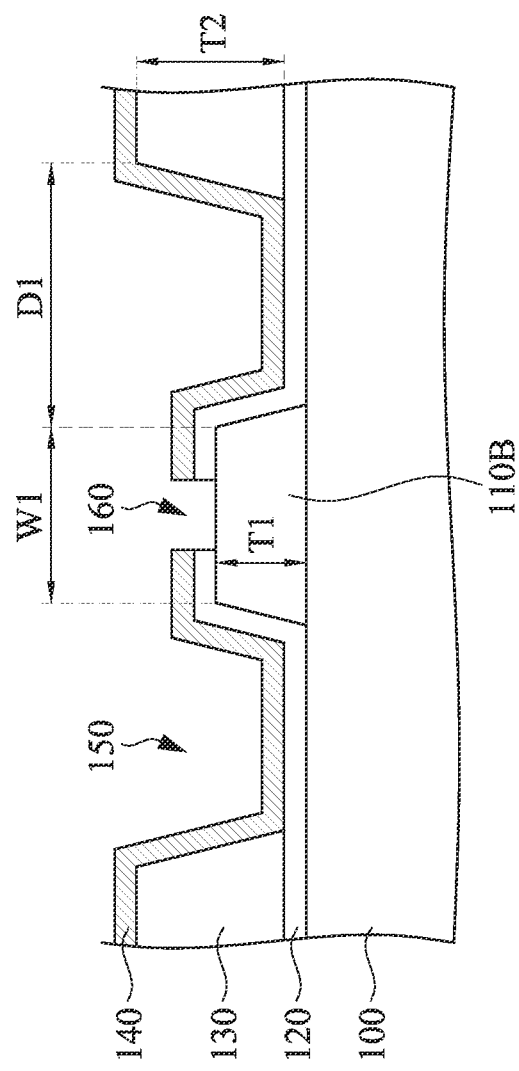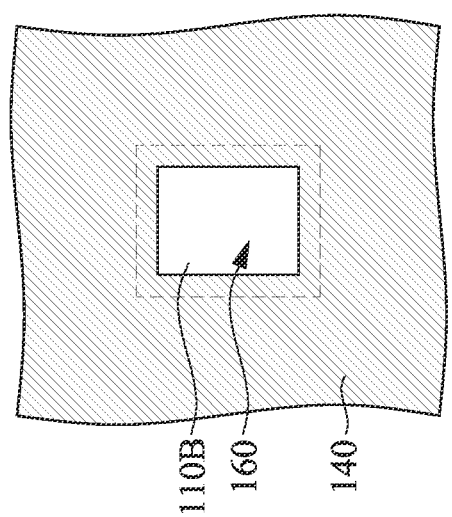
Fig. 3A
Fig. 3B

CIRCUIT BOARD STRUCTURE FOR DISPLAY DEVICE

CROSS-REFERENCE TO RELATED APPLICATION

This application claims priority to U.S. Provisional Application Ser. No. 63/313,744, filed Feb. 25, 2022, and Taiwan Application Serial Number 111128198, filed Jul. 27, 2022, the disclosures of which are incorporated herein by reference in their entireties.

BACKGROUND

Field of Invention

The present disclosure relates to the circuit board structure. More particularly, the present disclosure relates to the circuit board structure for the display device.

Description of Related Art

Generally, a circuit board structure for the display device has a structure of alternately stacked inorganic material layers and organic material layers. When the organic material layer is exposed to the external environment, the organic material layer may absorb the moisture. The absorbed moisture can be released from the organic material layer in the subsequent high temperature process or low pressure process. The released moisture may lower the reliability of the circuit board structure, thereby impacting the yield of the final display device.

SUMMARY

According to some embodiments of the present disclosure, a circuit board structure for a display device includes a substrate, a bump, a protective layer, and a moisture-resistant layer. The substrate includes a first surface and a second surface opposite to the first surface. The bump is disposed on the first surface of the substrate and includes a first inorganic material. The protective layer is disposed on the first surface of the substrate. The protective layer includes an organic material and a first opening, in which the bump is positioned in the first opening. The moisture-resistant layer entirely covers the protective layer. The moisture-resistant layer includes a second inorganic material and a second opening, in which a portion of the bump is exposed in the second opening.

In some embodiments, the moisture-resistant layer directly contacts the protective layer.

In some embodiments, the moisture-resistant layer is conformally deposited on the protective layer and the bump.

In some embodiments, the moisture-resistant layer covers sidewalls of the first opening and an upper surface of the protective layer.

In some embodiments, a thickness of the protective layer is larger than a thickness of the bump.

In some embodiments, a ratio of a thickness of the protective layer to a thickness of the bump is equal to or larger than 3.

In some embodiments, a ratio of a distance between at least one side edge of the bump and the protective layer to a width of the bump is in a range of 1.5 to 2.0.

In some embodiments, the circuit board structure for the display device further includes a circuit layer disposed on the second surface of the substrate.

In some embodiments, the circuit board structure for the display device further includes a wire disposed on the first surface of the substrate. The bump is connected to the wire, and the first inorganic material is a conductive material.

In some embodiments, the circuit board structure for the display device further includes a wire disposed on the first surface of the substrate, in which the bump and the wire are electrically isolated.

According to some other embodiments of the present disclosure, a circuit board structure for a display device includes a substrate, an alignment mark, a protective layer, and a moisture-resistant layer. The alignment mark is disposed on the substrate and includes a first inorganic material. The protective layer is disposed on the substrate and around the alignment mark, and the protective layer includes an organic material. The moisture-resistant layer entirely covers the protective layer. The moisture-resistant layer includes a second inorganic material and a second opening, in which a portion of the alignment mark is exposed in the second opening of the moisture-resistant layer.

In some embodiments, the protective layer includes a first opening, in which the alignment mark is disposed in the first opening of the protective layer to be laterally surrounded by the protective layer.

In some embodiments, an upper surface of the protective layer is higher than an upper surface of the alignment mark.

In some embodiments, the alignment mark is disposed on the protective layer, and an upper surface of the alignment mark is higher than an upper surface of the protective layer.

In some embodiments, the alignment mark covers a portion of the upper surface of the protective layer while the moisture-resistant layer covers another portion of the upper surface of the protective layer.

In some embodiments, the moisture-resistant layer covers sidewalls and the upper surface of the alignment mark.

In some embodiments, the moisture-resistant layer has a uniform thickness and is conformally deposited on the protective layer and the alignment mark.

In some embodiments, the circuit board structure for the display device further includes a passivation layer disposed between the substrate and the protective layer. A material of the passivation layer is same as that of the moisture-resistant layer.

In some embodiments, the passivation layer covers sidewalls of the alignment mark.

In some embodiments, the passivation layer includes the second opening. The portion of the alignment mark is exposed in the second opening of the passivation layer.

The embodiments of the present disclosure provide a circuit board structure for the display device. The moisture-resistant layer is formed to entirely cover the protective layer including the organic material, which reduce the possibility of the external moisture absorption of the protective layer to improve the reliability of the circuit board structure for the display device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, unless otherwise stated, the repeated reference numeral indicates the same element.

FIG. 3A illustrates a partial cross-sectional view of a circuit board structure for the display device according to some other embodiments of the present disclosure.

FIG. 3B illustrates a partial top view of the circuit board structure for the display device in FIG. 3A according to some embodiments of the present disclosure.

DETAILED DESCRIPTION

Figure 1:
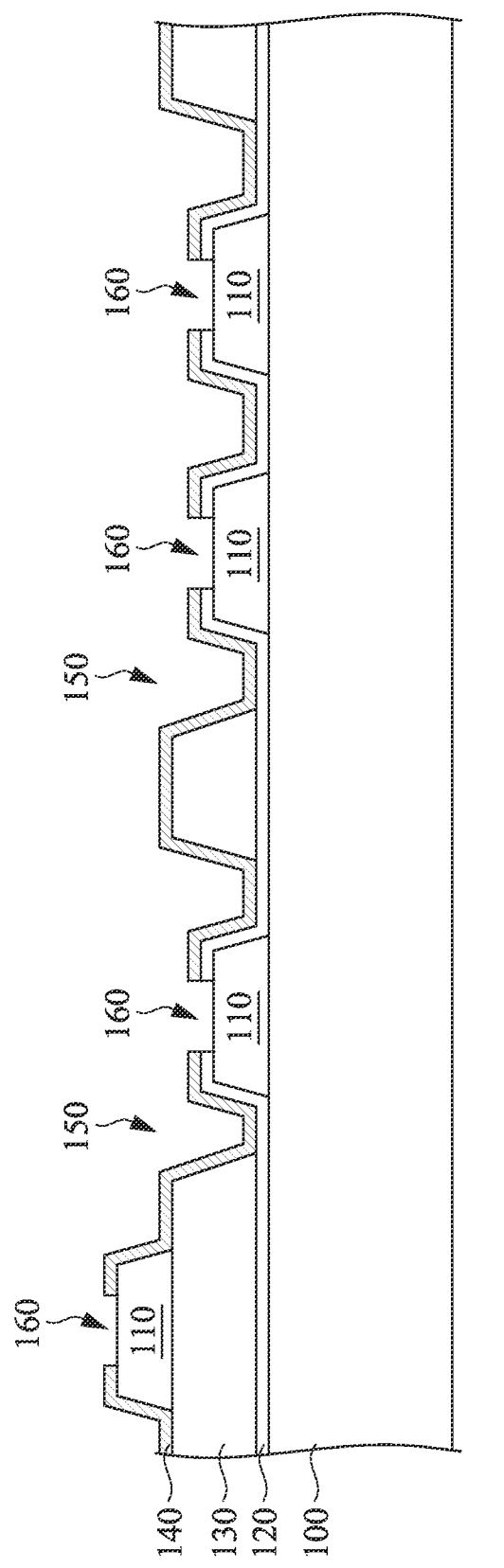
FIG. 1 illustrates a cross-sectional view of a circuit board structure for the display device at one manufacturing stage according to some embodiments of the present disclosure.

The formation of a first feature on or connected to a second feature in the description that follows may include embodiments in which the first and second features are formed in direct contact, and may also include embodiments in which additional features may be formed between the first and second features, such that the first and second features may not be in direct contact. In the contrary, the formation of a first feature directly on or directly connected to a second feature includes embodiments in which the first and second features are formed without another feature between the two features. As used herein, "connection" may be referred as physically and/or electrically connection. In addition, "electrically connected" or "coupled" of two elements may include another element between the two elements.

Further, spatially relative terms, such as "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figure is flipped, the element at the lower side of the other(s) may be defined as those at the upper side of the other(s). Therefore, the spatially relative term "below" may include the orientation of "below" and "above."

Although the terms "first", "second", "third", etc., can be used to describe various elements, components, regions, layers and/or parts in this specification, these elements, components, regions, layers and/or parts should not be limited by these terms. These terms are used only to distinguish one element, component, region, layer, or part from another element, component, region, layer, or part. Therefore, the first element, component, region, layer, or part discussed below may be referred to as a second element, component, region, layer, or part without departing from the instructions of the specification.

The terms such as "about," "close to," "substantially" and the like used herein may include the given value and the average of the acceptable deviation of the given value for those skilled in the art considering the discussed measuring manner and the relative deviation amount (i.e., the limit of the measuring system). For example, the term "about" may indicate the values in one or more deviation.

Unless otherwise stated, those skilled in the art should understand that the terms (including technical and science terms) used herein have the general meanings in the relative field. Furthermore, the terms defined in general dictionary should be interpreted corresponding to their meanings in the relative technic and the specification of this disclosure, and unless clearly stated, those terms would not be interpreted in idealized or overly formal manner.

Generally, a circuit board structure for the display device has a structure of alternately stacked inorganic material layers and organic material layers. When the organic material layer is exposed to the atmospheric environment, the ambient gas, such as moisture, may be absorbed by and exist in the organic material layer. In the subsequent high temperature process or low pressure process (for example, a chemical vapor deposition (CVD) process), the ambient gas may be released from the organic material layer and may interfere the process conditions or impact the circuit board structure, which lowers the reliability of the circuit board structure and further impacts the yield of the final display device. The circuit board structure for the display device provided by some embodiments of the present disclosure includes a moisture-resistant layer, in which the moisture-resistant layer includes an inorganic material. The moisture-resistant layer can entirely cover the organic material layer to reduce the possibility of the ambient gas absorption of the organic material layer, thereby improving the reliability of the circuit board structure for the display device.

Referring to FIG. 1, FIG. 1 illustrates a cross-sectional view of a circuit board structure for the display device at one manufacturing stage according to some embodiments of the present disclosure. The circuit board structure for the display device includes a substrate 100, a passivation layer 120 disposed on the substrate 100, a protective layer 130 disposed on the passivation layer 120, and a moisture-resistant layer 140 disposed on the protective layer 130. The circuit board structure for the display device further includes a bump 110 disposed on the substrate 100, in which the protective layer 130 is disposed around the bump 110. The relative arrangement of the bump 110 and the protective layer 130 may be adjusted according to different process conditions and product designs.

In some embodiments, the protective layer 130 may include a first opening 150, in which one or more bumps 110 may be positioned in the first opening 150 of the protective layer 130. In other words, the protective layer 130 may laterally surround one or more bumps 110 and not in contact with the bumps 110. In some other embodiments, the bump 110 may be disposed on the protective layer 130 and cover a portion of the protective layer 130.

The moisture-resistant layer 140 may be conformally deposited on the protective layer 130 and the bump 110. Specifically, the moisture-resistant layer 140 may be formed on the protective layer 130 and the bump 110 along the profile of the protective layer 130 and the profile of the bump 110. As a result, the profile of the moisture-resistant layer 140 becomes similar to the profile of the protective layer 130 and the profile of the bump 110. In some embodiments, the moisture-resistant layer 140 may have a uniform thickness.

The moisture-resistant layer 140 may entirely cover the protective layer 130. As shown in FIG. 1, the moisture-resistant layer 140 may cover the opening sidewalls and the upper surface of the protective layer 130 and may cover the sidewalls and the upper surface of the bump 110. The protective layer 130 covered by the moisture-resistant layer 140 would not be exposed to the external environment and the moisture. In some embodiments, the moisture-resistant layer 140 may cover the protective layer 130 by directly contacting the protective layer 130.

The moisture-resistant layer 140 may include a second opening 160 above the upper surface of the bump 110, so that a portion of the bump 110 is exposed in the second opening 160 of the moisture-resistant layer 140.

The substrate 100 may have a multilayer structure, in which the multilayer structure includes alternately stacked inorganic material layers and organic material layers. The bump 110 may include an inorganic material, for example, metal, metal oxide, silicon oxide, silicon nitride, silicon oxynitride, other suitable material, or combinations thereof. In some embodiments, the metal oxide may be indium tin oxide (ITO), indium zinc oxide (IZO), or the like. The passivation layer 120 may include silicon oxide, silicon nitride, silicon oxynitride, other suitable material, or combinations thereof. The protective layer 130 may include an organic material. In some embodiments, the protective layer 130 may act as a planarization layer. The moisture-resistant layer 140 may include an inorganic material, for example, silicon oxide, silicon nitride, silicon oxynitride, other non-absorbent material, or combinations thereof. In some embodiments, the material of the passivation layer 120 may be the same as that of the moisture-resistant layer 140. In some embodiments, the material of the passivation layer 120 may be different from that of the moisture-resistant layer 140.

Figure 2A:
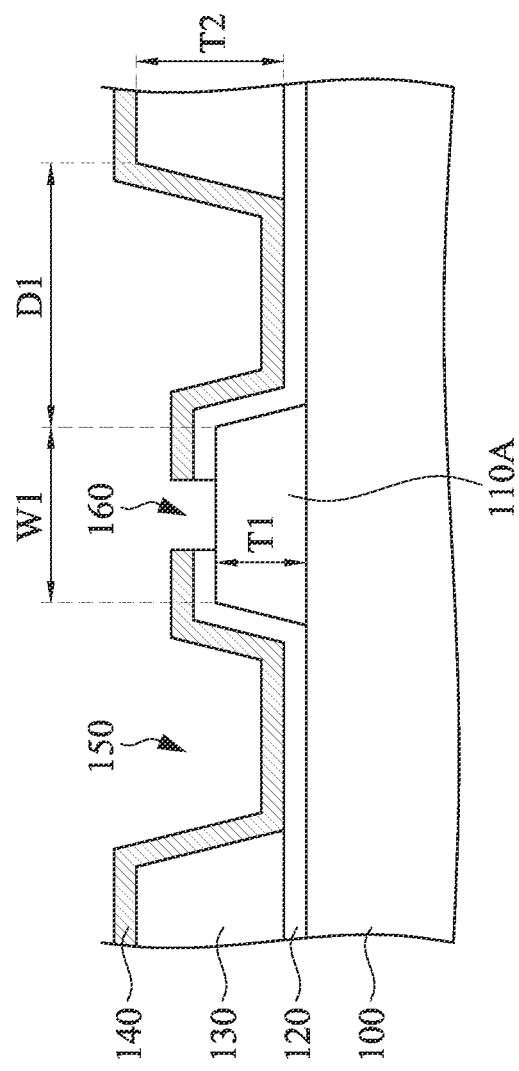
FIG. 2A illustrates a partial cross-sectional view of a circuit board structure for the display device according to some embodiments of the present disclosure.
Figure 2B:
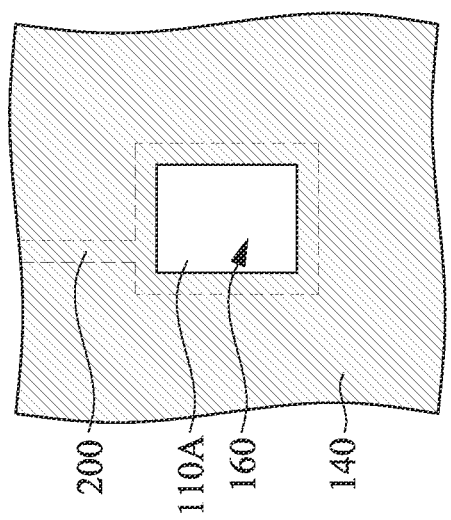
FIG. 2B illustrates a partial top view of the circuit board structure for the display device in FIG. 2A according to some embodiments of the present disclosure.

Referring to FIG. 2A and FIG. 2B, FIG. 2A illustrates a partial cross-sectional view of a circuit board structure for the display device according to some embodiments of the present disclosure, and FIG. 2B illustrates a partial top view of the circuit board structure for the display device in FIG. 2A according to some embodiments of the present disclosure. In FIG. 2B, a landing pad 110A and a wire 200 below the moisture-resistant layer 140 are illustrated in dashed line. Some elements are omitted in FIG. 2B to simplify the figure. Although FIG. 2A illustrates one bump 110 (referring to FIG. 1) in the first opening 150 of the protective layer 130 for exemplary purpose, the following description may be applied to the embodiments which more than one bumps 110 are positioned in the first opening 150 of the protective layer 130.

In some embodiments, the circuit board structure for the display device may further include the wire 200, as shown in FIG. 2B. When the bump 110 (as shown in FIG. 1) is positioned in the first opening 150 of the protective layer 130, and the bump 110 is electrically connected to the wire 200, the bump 110 may be referred as a landing pad 110A. In such embodiments, the inorganic material of the landing pad 110A may be a conductive material. The landing pad 110A may be electrically connected to other electrical elements (not shown) by the wire 200. The wire 200 may be directly connected to the landing pad 110A. Although the landing pad 110A in FIG. 2B is illustrated as a rectangle, it is not intended to be limiting, and the landing pads having other suitable shapes are within the scope of the present disclosure.

The landing pad 110A and the protective layer 130 respectively has a thickness T1 and a thickness T2, in which the thickness T2 of the protective layer 130 may be larger than the thickness T1 of the landing pad 110A. In other words, the upper surface of the protective layer 130 may be higher than the upper surface of the landing pad 110A. In some embodiments, a ratio of the thickness T2 of the protective layer 130 to the thickness T1 of the landing pad 110A may be equal to or larger than about 3. If the ratio of the thickness T2 of the protective layer 130 to the thickness T1 of the landing pad 110A is smaller than about 3, the protective layer 130 may not be able to sufficiently protect the landing pad 110A. For example, the subsequent cutting operation for the circuit board may lead to debris, and the protective layer 130 surrounding the landing pad 110A may act as a mask to prevent the landing pad 110A from being scratched by the debris. Therefore, the protective layer 130 may provide high scratch resistance. If the ratio is smaller than the above-mentioned lower limit, the landing pad 110A may be scratched by the debris, which reduces the yield of the landing pad 110A.

It should be noted that, the thickness T2 of the protective layer 130 is not unboundedly larger than the thickness T1 of the landing pad 110A. The upper limit of the ratio of the thickness T2 of the protective layer 130 to the thickness T1 of the landing pad 110A may depend on the subsequent process for forming a first opening 150, such as a lithography process. The ratio of the thickness T2 of the protective layer 130 to the thickness T1 of the landing pad 110A may be controlled to form the first opening 150 which exposes the landing pad 110A for preventing the electrical failure.

Moreover, a side edge of the landing pad 110A and the protective layer 130 may be isolated by a distance D1, while the landing pad 110A has a width W1. The distance D1 and the width W1 are defined at the upper surface of the protective layer 130 and the upper surface of the landing pad 110A. In some embodiments, a ratio of the distance D1 between the side edge of the landing pad 110A and the protective layer 130 to the width W1 of the landing pad 110A may be in a range of about 1.5 to about 2.0. If the ratio of the distance D1 between the side edge of the landing pad 110A and the protective layer 130 to the width W1 of the landing pad 110A is smaller than the above-mentioned lower limit, the protective layer 130 may cover the landing pad 110A and impact the functionality (for example, electrical connection or bonding strength) of the landing pad 110A. In addition, such distance between the side edge of the landing pad 110A and the protective layer 130 may be too small to fill the moisture-resistant layer 140 that covers the opening sidewalls of the protective layer 130 in the first opening 150, so that the moisture-resistant layer 140 may not entirely cover the protective layer 130. In this case, the protective layer 130 may be exposed and absorb the moisture, thereby reducing the yield. If the ratio of the distance D1 between the side edge of the landing pad 110A and the protective layer 130 to the width W1 of the landing pad 110A is larger than the above-mentioned upper limit, the scratch resistance of the protective layer 130 for protecting the landing pad 110A may be reduced.

Referring to FIG. 3A and FIG. 3B, FIG. 3A illustrates a partial cross-sectional view of a circuit board structure for the display device according to some other embodiments of the present disclosure, and FIG. 3B illustrates a partial top view of the circuit board structure for the display device in FIG. 3A according to some embodiments of the present disclosure. In FIG. 3B, an alignment mark 110B below the moisture-resistant layer 140 is illustrated in dashed line. Some elements are omitted in FIG. 3B to simplify the figure. Although FIG. 3A illustrates one bump 110 (referring to FIG. 1) in the first opening 150 of the protective layer 130 for exemplary purpose, the following description may be applied to the embodiments which more than one bumps 110 are positioned in the first opening 150 of the protective layer 130.

In some embodiments, the bump 110 in the first opening 150 of the protective layer 130 may be used as a reference mark for alignment, thereby being referred as the alignment mark 110B. One functionality of the alignment mark 110B may be calibrating the position of the circuit board structure, so that the circuit board structure with the alignment mark 110B is at the right position after moving the circuit board structure (for example, after flipping the circuit board structure). This ensures the accuracy of the subsequent processes.

Roughly speaking, the structure shown in FIG. 3A and FIG. 3B is similar to the structure shown in FIG. 2A and FIG. 2B, except the alignment mark 110B in FIG. 3B is not connected to the electrical elements, such as the wire 200 in FIG. 2B. In other words, the alignment mark 110B and other electrical elements (for example, the wire 200 in FIG. 2B) may be electrically isolated.

The alignment mark 110B and the protective layer 130 respectively has a thickness T1 and a thickness T2, in which the thickness T2 of the protective layer 130 may be larger than the thickness T1 of the alignment mark 110B. In other words, the upper surface of the protective layer 130 may be higher than the upper surface of the alignment mark 110B. In some embodiments, a ratio of the thickness T2 of the protective layer 130 to the thickness T1 of the alignment mark 110B may be equal to or larger than about 3. If the ratio of the thickness T2 of the protective layer 130 to the thickness T1 of the alignment mark 110B is smaller than about 3, the protective layer 130 may not be able to sufficiently protect the landing pad 110A. For example, the protective layer 130 provides protection from scratching, so that the alignment mark 110B may be masked by the protective layer 130 to prevent from being scratched by the debris in the subsequent cutting operation for the circuit board. If the ratio is smaller than the above-mentioned lower limit, the alignment mark 110B may be scratched by the debris, which reduces the alignment accuracy and the yield of the circuit board structure.

It should be noted that, the thickness T2 of the protective layer 130 is not unboundedly larger than the thickness T1 of the alignment mark 110B. The upper limit of the ratio of the thickness T2 of the protective layer 130 to the thickness T1 of the alignment mark 110B may depend on the subsequent process for forming a first opening 150, such as a lithography process. This ensures the formation of the first opening 150 which exposes the alignment mark 110B to maintain the accuracy of alignment.

Moreover, a side edge of the alignment mark 110B and the protective layer 130 may be isolated by a distance D1, while the alignment mark 110B has a width W1. The distance D1 and the width W1 are defined at the upper surface of the protective layer 130 and the upper surface of the alignment mark 110B. In some embodiments, a ratio of the distance D1 between the side edge of the alignment mark 110B and the protective layer 130 to the width W1 of the alignment mark 110B may be in a range of about 1.5 to about 2.0. If the ratio of the distance D1 between the side edge of the alignment mark 110B and the protective layer 130 to the width W1 of the alignment mark 110B is smaller than the above-mentioned lower limit, the protective layer 130 may cover the alignment mark 110B and impact the functionality (for example, providing alignment accuracy) of the alignment mark 110B. In addition, such distance between the side edge of the alignment mark 110B and the protective layer 130 may be too small to fill the moisture-resistant layer 140 that covers the opening sidewalls of the protective layer 130 in the first opening 150, so that the moisture-resistant layer 140 may not entirely cover the protective layer 130. As a result, the protective layer 130 may be exposed and absorb the moisture, thereby reducing the yield. If the ratio of the distance D1 between the side edge of the alignment mark 110B and the protective layer 130 to the width W1 of the alignment mark 110B is larger than the above-mentioned upper limit, the scratch resistance of the protective layer 130 for protecting the alignment mark 110B may be reduced.

Figure 4:
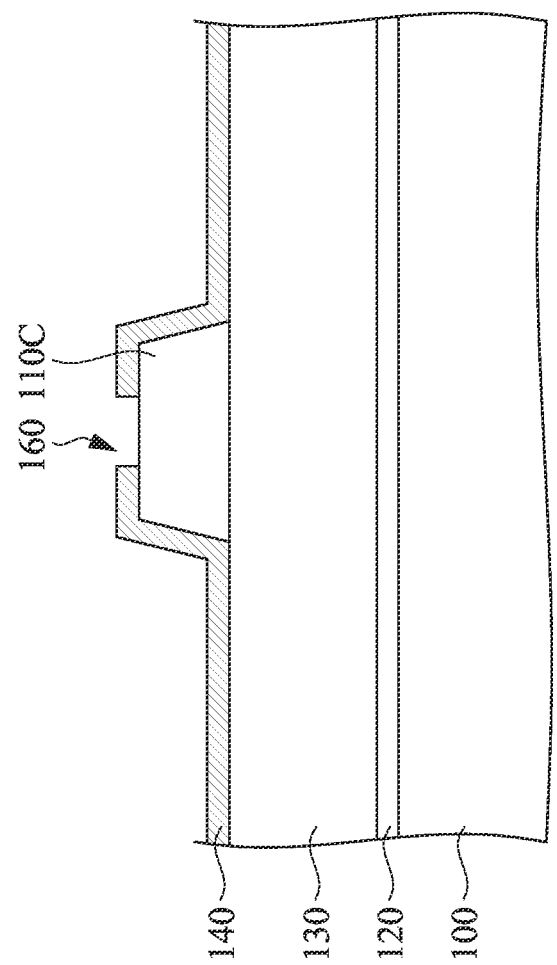
FIG. 4 illustrates a partial cross-sectional view of a circuit board structure for the display device according to some other embodiments of the present disclosure.

Referring to FIG. 4, FIG. 4 illustrates a partial cross-sectional view of a circuit board structure for the display device according to some other embodiments of the present disclosure. In some embodiments, the bump 110 on the protective layer 130 may be used as a reference mark for alignment and be referred as an alignment mark 110C. Specifically, the upper surface of the alignment mark 110C is higher than the upper surface of the protective layer 130. The alignment mark 110C covers a portion of the upper surface of the protective layer 130 while the moisture-resistant layer 140 covers another portion of the upper surface of the protective layer 130, so that the protective layer 130 is not exposed. The moisture-resistant layer 140 may also cover the sidewalls and the upper surface of the alignment mark 110C, while the moisture-resistant layer 140 includes a second opening 160 exposing at least a portion of the alignment mark 110C.

FIGS. 5A-5E illustrate partial cross-sectional views of a circuit board structure for the display device at different manufacturing stages according to some embodiments of the present disclosure, specifically the cross-sectional views of the formation of the bump laterally surrounded by the protective layer at different manufacturing stages. It should be noted that, unless otherwise illustrated, the order in which some or all operations illustrated in the following embodiments should not be construed to imply that these operations are necessarily order dependent. For example, some operations can be applied in orders different from the described embodiments, some operations can be applied simultaneously, some operations can be omitted and/or some operations can be repeated. In addition, additional operations can be provided before, during, and/or after the illustrated operations to form the circuit board structure for the display device. Therefore, the present disclosure may briefly illustrate some additional operations.

Figure 5A:
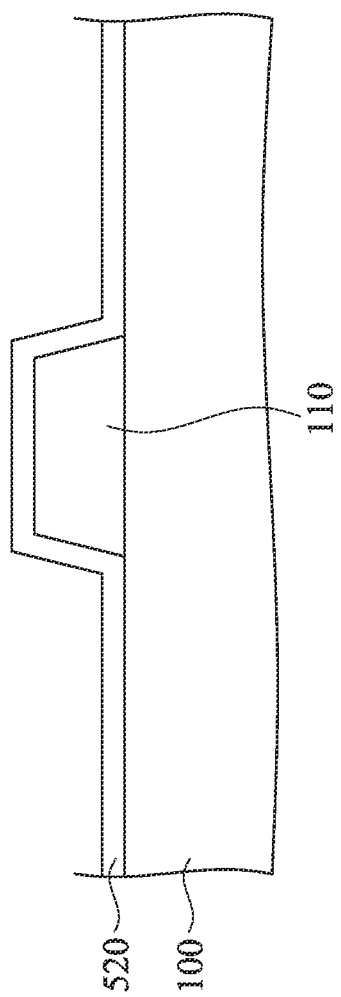
FIGS. 5A-5E illustrate partial cross-sectional views of a circuit board structure for the display device at different manufacturing stages according to some embodiments of the present disclosure.

Referring to FIG. 5A, the bump 110 (for example, the landing pad 110A in FIG. 2A or the alignment mark 110B in FIG. 3A) is formed on the substrate 100. Then, a passivation layer material 520 is conformally deposited on the substrate 100 and the bump 110. Specifically, the passivation layer material 520 covers the upper surface of the substrate 100, the sidewalls of the bump 110, and the upper surface of the bump 110.

Figure 5B:
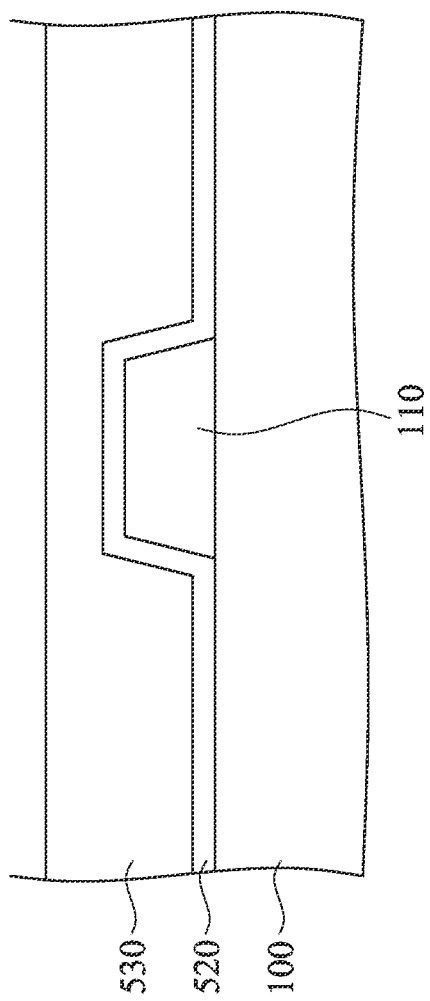

Referring to FIG. 5B, a protective layer material 530 is formed on the substrate 100 and the bump 110. The protective layer material 530 may directly contact the passivation layer material 520. The protective layer material 530 may entirely cover the bump 110 and the passivation layer material 520, so that the bump 110 is not exposed. In some embodiments, a planarization process, such as chemical mechanical polishing (CMP), may be applied to the upper surface of the protective layer material 530.

Figure 5C:
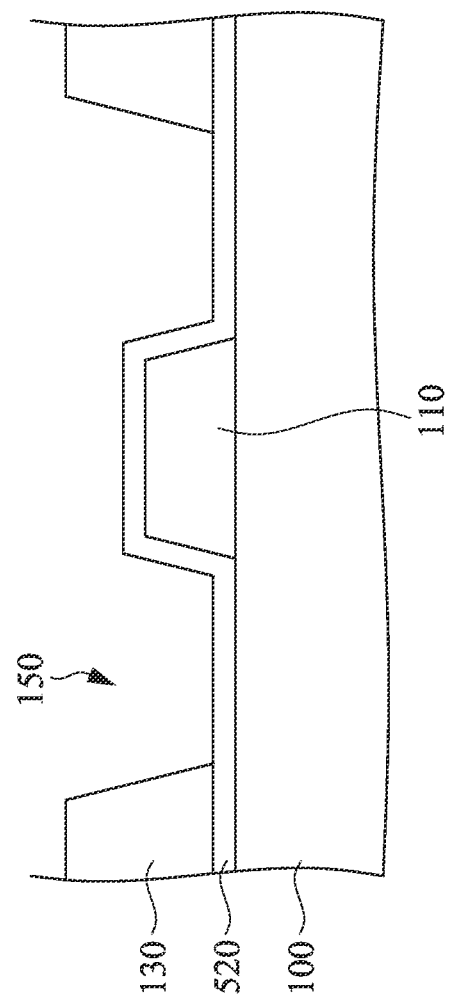

Referring to FIG. 5C, a lithography process is performed on the protective layer material 530 in FIG. 5B to form the protective layer 130 including the first opening 150 from the protective layer material 530. The formed first opening 150 may expose the bump 110. In some embodiments, the opening sidewalls of the protective layer 130 in the first opening 150 may be separated from the bump 110. In other words, the protective layer 130 may not contact the bump 110.

Figure 5D:
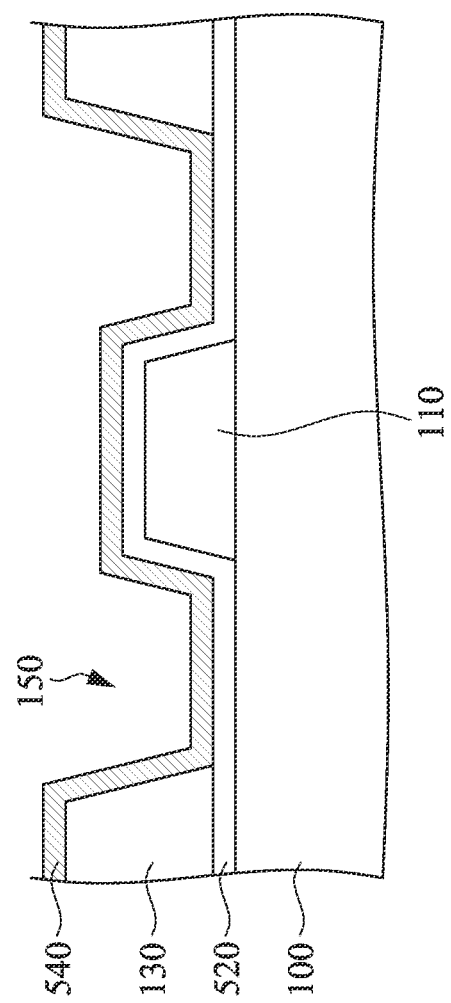

Referring to FIG. 5D, a moisture-resistant layer material 540 is formed on the protective layer 130 and the bump 110. The moisture-resistant layer material 540 may entirely cover the surfaces of the protective layer 130, such as the upper surface or the side surfaces of the protective layer 130. Therefore, the protective layer 130 would not reach the external moisture. In some embodiments, the moisture-resistant layer material 540 may be formed along the profile of the protective layer 130 and the profile of the bump 110, so that the profile of the moisture-resistant layer material 540 is similar to those of the protective layer 130 and the bump 110. In some embodiments, the moisture-resistant layer material 540 may have a uniform thickness.

Figure 5E:
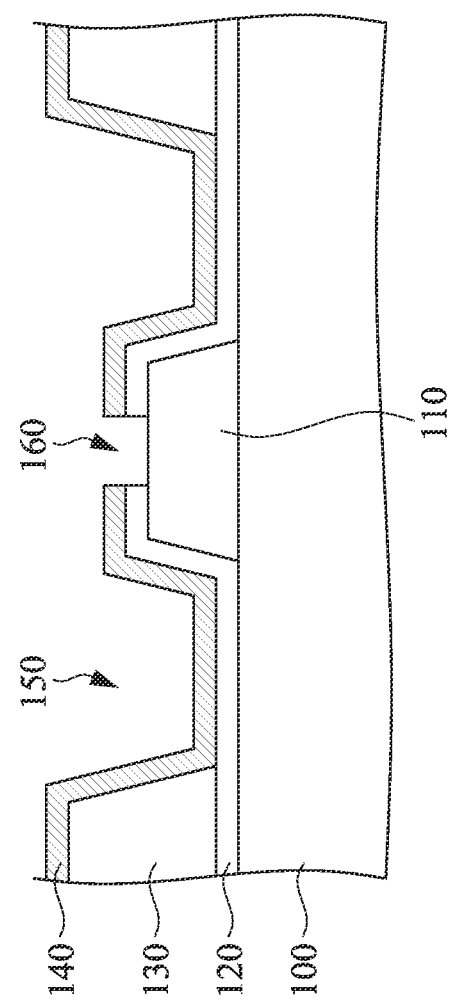

Referring to FIG. 5E, a lithography process is performed on the moisture-resistant layer material 540 and the passivation layer material 520 in FIG. 5D, which forms the moisture-resistant layer 140 including the second opening 160 from the moisture-resistant layer material 540 and the passivation layer 120 including the second opening 160 from the passivation layer material 520.

Figure 6:
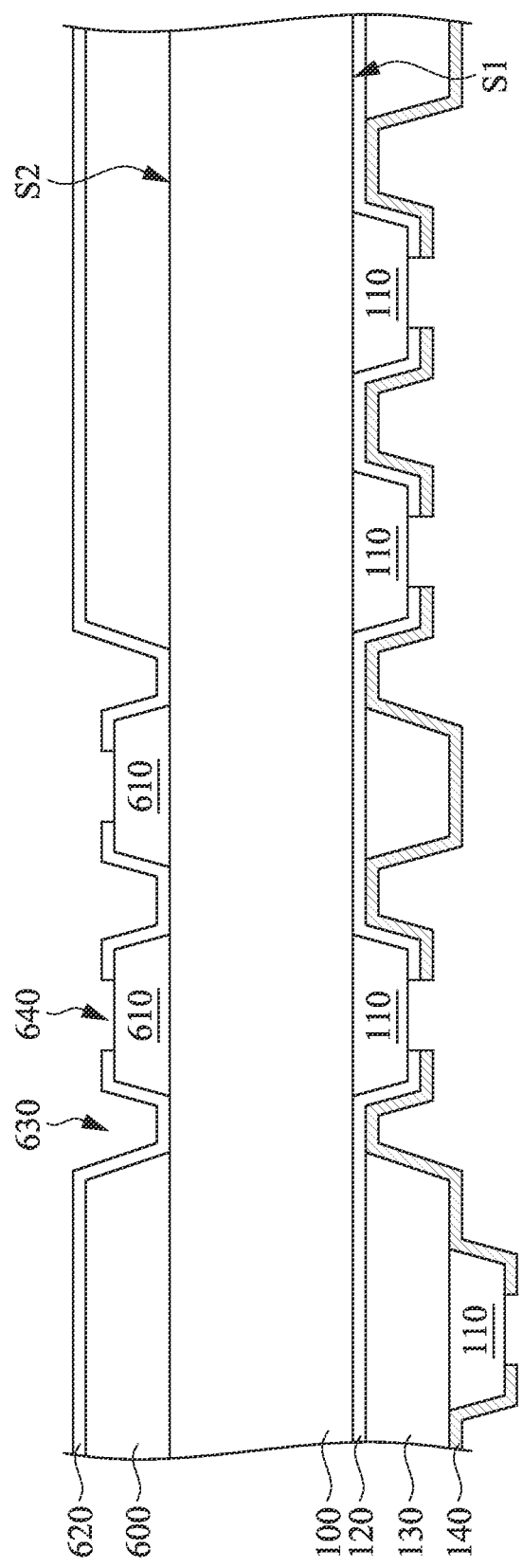
FIG. 6 illustrates a cross-sectional view of a circuit board structure for the display device at one manufacturing stage according to some embodiments of the present disclosure.

Referring to FIG. 6, FIG. 6 illustrates a cross-sectional view of a circuit board structure for the display device at one manufacturing stage according to some embodiments of the present disclosure. After the bump 110 is formed on one side of the substrate 100, the circuit board structure in FIG. 1 is flipped upside-down to further dispose the circuit layer on the other side of the substrate 100. For example, the substrate 100 may include a first surface S1 and a second surface S2, in which the first surface S1 and the second surface S2 are on opposite sides of the substrate 100. After the bump 110, the passivation layer 120, the protective layer 130, and the moisture-resistant layer 140 are disposed on the first surface S1 of the substrate 100, a flat layer 600, an insulation layer 620, a wire (not shown), and a bump 610 may be disposed on the second surface S2 of the substrate 100. The bump 610 may be disposed in a third opening 630 of the flat layer 600. A fourth opening 640 of the insulation layer 620 may expose a portion of the upper surface of the bump 610. In some embodiments, the circuit layer of the second surface S2 may be further connected to a flexible circuit board (not shown) to transmit the control signal or display signal.

In some embodiments which the circuit board structure is applied in the light emitting diode (LED) display device, light emitting elements are disposed on corresponding landing pads (for example, on the landing pad 110A in FIG. 2A) after the needed layers or components (for example, wires, landing pads, alignment marks, or the like) being formed on opposite sides of the circuit board structure to continue the manufacturing process of the display device.

The moisture-resistant layer 140 including the inorganic material may entirely cover the protective layer 130 including the organic material to stop the external gas, such as moisture, from entering the protective layer 130. As a result, rare or none gas/moisture is released from the protective layer 130 in the subsequent high temperature process or low pressure process, for example, the various layer formation by using CVD or physical vapor deposition (PVD). This reduces the interference during the manufacturing process. Therefore, the circuit board structure may maintain its original state (for example, the original shape, volume, structure, composition, or the like), which helps to improve the reliability of the circuit board structure.

According to the above-mentioned, the circuit board structure for the display device provided by some embodiments of the present disclosure includes the moisture-resistant layer. The moisture-resistant layer entirely cover the protective layer including the organic material to lower the possibility of the external moisture absorption of the protective layer, thereby improving the reliability of the circuit board structure for the display device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board structure for a display device, comprising:
   a substrate comprising a first surface and a second surface opposite to the first surface;
   a bump disposed on the first surface of the substrate, wherein the bump comprises a first inorganic material;
   a protective layer disposed on the first surface of the substrate, wherein the protective layer comprises an organic material and a first opening, and wherein the bump is positioned in the first opening; and
   a moisture-resistant layer covering sidewalls of the protective layer in the first opening and an upper surface of the protective layer, wherein the moisture-resistant layer comprise a second inorganic material and a second opening, and wherein a portion of the bump is exposed in the second opening.

2. The circuit board structure for the display device of claim 1, wherein the moisture-resistant layer directly contacts the protective layer.

3. The circuit board structure for the display device of claim 1, wherein the moisture-resistant layer is conformally deposited on the protective layer and the bump.

4. The circuit board structure for the display device of claim 1, wherein a thickness of the protective layer is larger than a thickness of the bump.

5. The circuit board structure for the display device of claim 1, wherein a ratio of a thickness of the protective layer to a thickness of the bump is equal to or larger than 3.

6. The circuit board structure for the display device of claim 1, wherein a ratio of a distance between at least one side edge of the bump and the protective layer to a width of the bump is in a range of 1.5 to 2.0.

7. The circuit board structure for the display device of claim 1, further comprising:
   a circuit layer disposed on the second surface of the substrate.

8. The circuit board structure for the display device of claim 1, further comprising:
   a wire disposed on the first surface of the substrate, wherein the bump is connected to the wire, and the first inorganic material is a conductive material.

9. The circuit board structure for the display device of claim 1, further comprising:

a wire disposed on the first surface of the substrate, wherein the bump and the wire are electrically isolated.

\* \* \* \* \*